(12) United States Patent
Ching et al.

(10) Patent No.: US 10,516,051 B2
(45) Date of Patent: Dec. 24, 2019

(54) FINFET AND METHOD OF FABRICATION THEREOF

(71) Applicant: TAIWAN SEMICONDUCTOR MANUFACTURING CO., LTD., Hsinchu (TW)

(72) Inventors: Kuo-Cheng Ching, Hsinchu County (TW); Kuan-Ting Pan, Taipei (TW); Ching-Wei Tsai, Hsinchu (TW); Ying-Keung Leung, Hsinchu (TW); Chih-Hao Wang, Hsinchu County (TW); Carlos H. Diaz, Mountain View, CA (US)

(73) Assignee: TAIWAN SEMICONDUCTOR MANUFACTURING, Hsinchu (TW)

( * ) Notice: Subject to any disclaimer, the term of this patent is extended or adjusted under 35 U.S.C. 154(b) by 0 days.

(21) Appl. No.: 15/235,233

(22) Filed: Aug. 12, 2016

(65) Prior Publication Data
US 2017/0345936 A1 Nov. 30, 2017

Related U.S. Application Data

(60) Provisional application No. 62/341,690, filed on May 26, 2016.

(51) Int. Cl.
*H01L 29/78* (2006.01)
*H01L 29/66* (2006.01)
*H01L 29/51* (2006.01)

(52) U.S. Cl.
CPC .... *H01L 29/7851* (2013.01); *H01L 29/66545* (2013.01); *H01L 29/66795* (2013.01); *H01L 29/518* (2013.01)

(58) Field of Classification Search
CPC .......... H01L 29/6681; H01L 29/66545; H01L 21/823431; H01L 29/785; H01L 29/7851; H01L 29/7855
See application file for complete search history.

(56) References Cited

U.S. PATENT DOCUMENTS

| | | | |
|---|---|---|---|
| 8,487,378 B2 | 7/2013 | Goto et al. | |
| 8,729,634 B2 | 5/2014 | Shen et al. | |
| 8,826,213 B1 | 9/2014 | Ho et al. | |
| 8,877,623 B2 * | 11/2014 | Tsai | H01L 21/283 |
| | | | 438/183 |
| 8,887,106 B2 | 11/2014 | Ho et al. | |
| 9,401,428 B2 * | 7/2016 | Choi | H01L 29/785 |
| 9,653,551 B2 * | 5/2017 | Oh | H01L 21/845 |
| 2014/0282326 A1 | 9/2014 | Chen et al. | |
| 2017/0062601 A1 * | 3/2017 | Basker | H01L 29/66636 |
| 2017/0352659 A1 * | 12/2017 | Basker | H01L 29/66795 |

* cited by examiner

*Primary Examiner* — Jose R Diaz
(74) *Attorney, Agent, or Firm* — McClure, Qualey & Rodack, LLP

(57) ABSTRACT

The present disclosure provides a fin-like field effect transistor (FinFET) device and a method of fabrication thereof. The method includes forming a fin on a substrate and forming a gate structure wrapping the fin. A pair of spacers is formed adjacent to the gate structure and the gate structure is removed. Afterwards, a pair of oxide layers is deposited adjacent to the pair of spacers. A pair of gate dielectric layers is deposited next to the pair of oxide layers. Finally, a metal gate is formed between the pair of gate dielectric layers.

20 Claims, 11 Drawing Sheets

FINFET AND METHOD OF FABRICATION THEREOF

RELATED APPLICATIONS

This application claims priority to U.S. Provisional Application Ser. No. 62/341,690, filed May 26, 2016, which is herein incorporated by reference.

BACKGROUND

Semiconductor devices are used in a large number of electronic devices, such as computer, communication, consumer electronics, cars and others. Semiconductor devices comprise integrated circuits (ICs) that are formed on semiconductor wafers by depositing many types of thin films of material over the semiconductor wafers, and patterning the thin films of material to form the integrated circuits. The common active element in the ICs is a field-effect transistor (FET). In scaling down of the FET, 3-dimensional field-effect transistor, e.g., a fin-like field-effect transistor (FinFET) has been developed to reduce the required area and also maintain the function that a typical planar field-effect transistors is able to provide and.

Such scaling down has also increased the complexity of processing and manufacturing the ICs. Although existing FinFET devices and methods of fabricating FinFET devices have been generally adequate for their intended purposes, there always have demands on FinFET design in scaling down of the manufacturing the ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
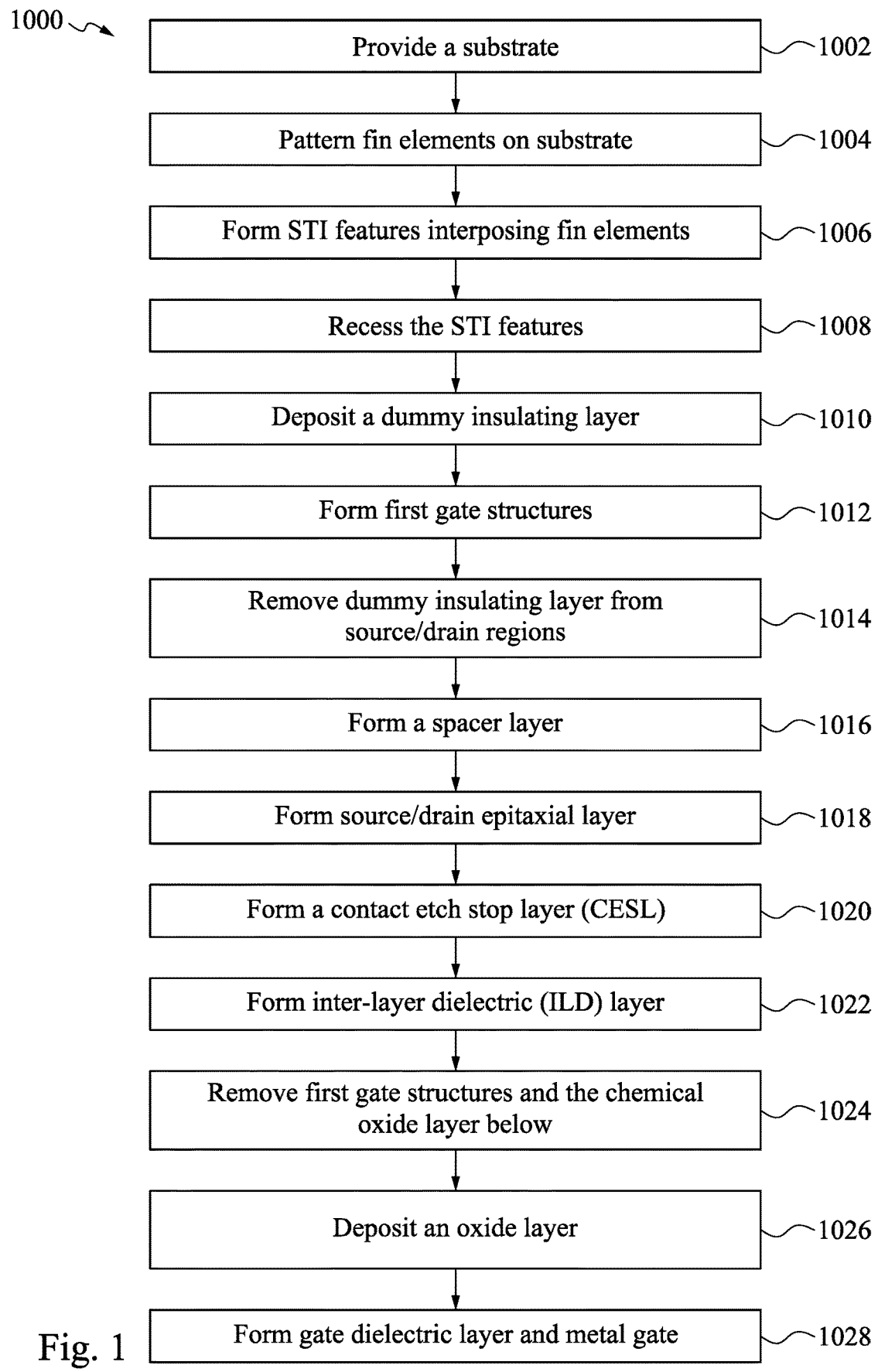
FIG. 1 is a flow chart of a method 1000 of fabricating FinFET device or portion thereof according to one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other examples of semiconductor devices that may benefit from aspects of the present disclosure. For example, some embodiments as described herein may also be applied to gate-all-around (GAA) devices, Omega-gate devices, or Pi-gate devices. The following disclosure will continue with a FinFET example to illustrate various embodiments of the present invention. It is understood, however, that the application should not be limited to a particular type of device, except as specifically claimed.

As the FinFET device sizes shrink, the gate length is also reduced. During a continuous complex fabrication procedure, wafers are subjected to wet cleaning and drying, which is helpful to prepare the surfaces and to remove residue left behind by some of the other processing. Along with the reduction of the gate length, higher and higher aspect ratio of a firstly made gate structure (or a "dummy gate") more and more often collapses from stiction during post etch wet cleaning and drying. Therefore, a solution is urgently needed to scale gate length without the firstly made gate structure collapse.

FIG. 1 is a flowchart of a method 1000 for fabricating a FinFET device in accordance with some embodiments. It is understood that additional operations may be implemented before, during, and after the method, and some of the operations described may be replaced or eliminated for other embodiments of the method. The FinFET device and the method 1000 making the same are collectively described with reference to various figures. In embodiments of the present disclosure, in operations 1002 and 1004, a fin is formed on a substrate. In operation 1012, a gate structure is formed to wrap the fin. In operation 1016, a pair of spacers is formed adjacent to the gate structure and the gate structure is removed. Afterwards, in operation 1026, a pair of oxide layers is deposited adjacent to the pair of spacers. In operation 1028, a pair of gate dielectric layers is deposited next to the pair of oxide layers, and a metal gate is formed between the pair of gate dielectric layers.

Figure 2:
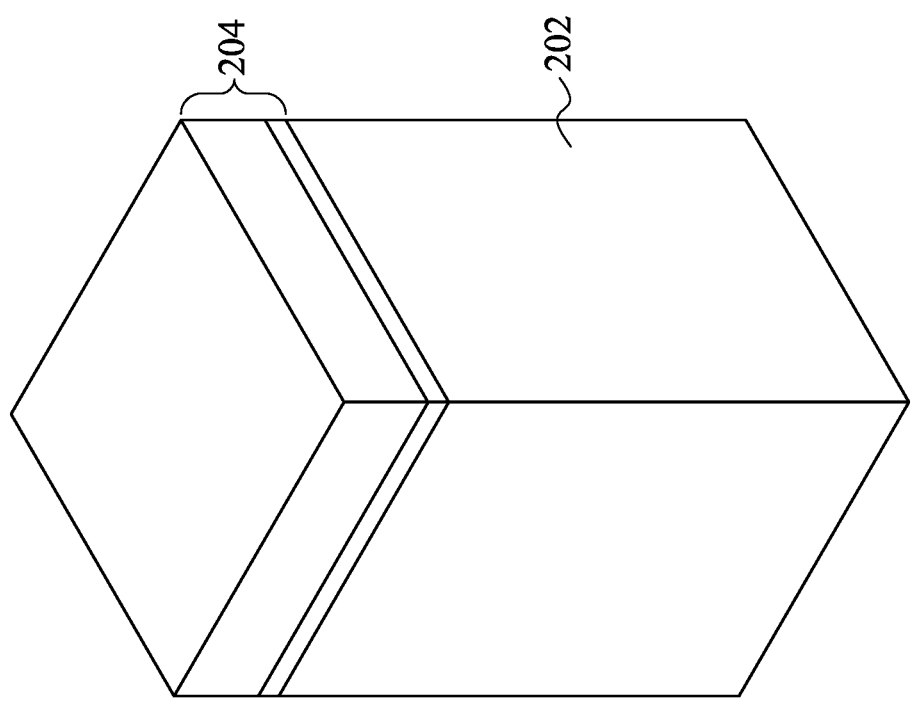

Referring to FIGS. 1 and 2, the method 1000 begins at operation 1002 by providing a substrate 202. In some embodiments, the substrate 202 may be a bulk silicon substrate. Alternatively, the substrate 202 may comprise an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb), a combination thereof, or other suitable materials. Further, the substrate 202 may also include a silicon-on-insulator (SOI) substrate. In some embodiments, an SOI substrate comprises a layer of a semiconductor material such as silicon (Si), germanium (Ge), silicon germanium (SiGe), silicon germanium on insulator (SGOI), or a combination thereof. In some embodiments, the SOI substrate is fabricated using separation by implantation of oxygen (SIMOX), and/or wafer bonding.

Referring again to FIG. 2. In one embodiment, the substrate 202 includes a hard mask layer 204 disposed thereon. In some embodiments, the hard mask layer 204 is used to define a pattern and to protect portions of the substrate 202 as illustrated below. The hard mask layer 204 may include silicon oxide, silicon nitride, titanium oxide, tantalum oxide, silicon carbide, silicon carbide nitride, or any other suitable material formed over. The hard mask layer 204 may be formed by depositing the suitable material formed through a process such as atomic layer deposition (ALD), thermal oxidation, chemical vapor deposition (CVD), plasma enhanced chemical vapor deposition (PECVD), low pressure chemical vapor deposition (LPCVD), or any other appropriate method.

Figure 3:
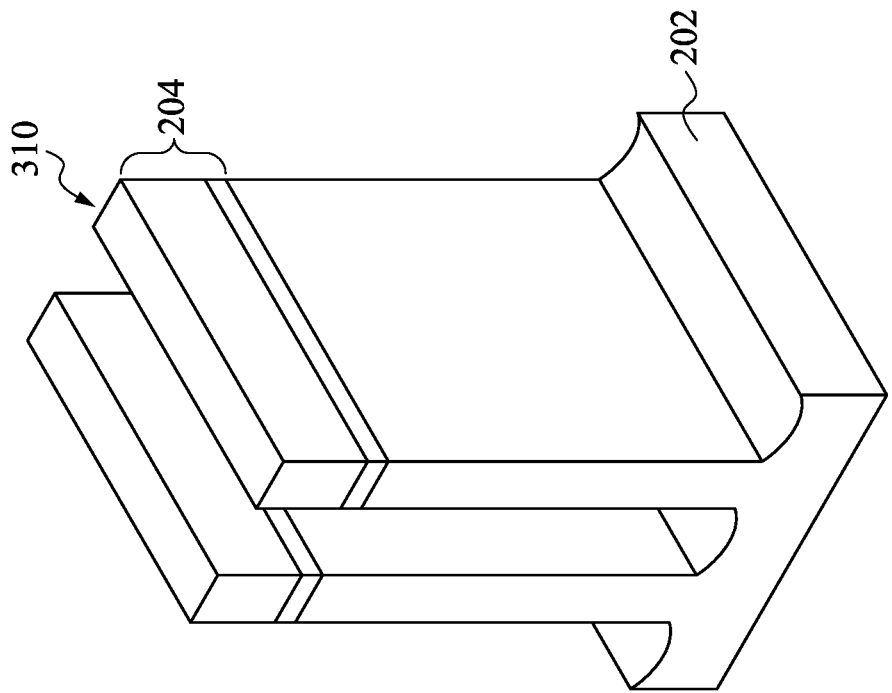
FIGS. 2 to 11 are isometric views of embodiments of the present disclosure.

Referring to FIG. 3, the method 1000 proceeds to operation 1004. The substrate 202 is etched to form the first fin structures 310 in the substrate 202 according to embodiments of the present disclosure. The etching process may include a wet etch or a dry etch. In one embodiment, the wet etching solution includes a tetramethylammonium hydroxide (TMAH), a HF/HNO$_3$/CH$_3$COOH solution, or other suitable solution. In some embodiments, the first fin elements 310 may define the "active" regions of the substrate where the transistor(s) will be formed.

Figure 4:
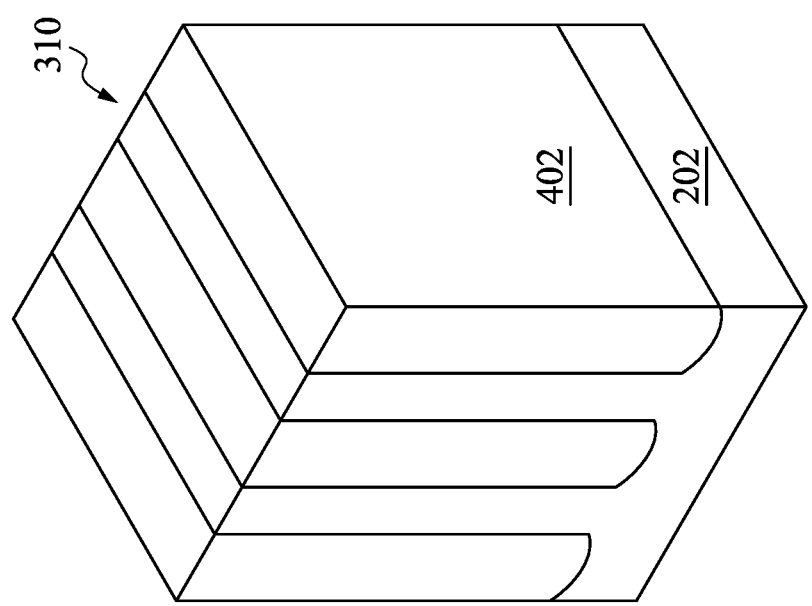

Referring to FIG. 4, the method 1000 then proceeds to operation 1006 where shallow trench isolation (STI) features 402 are formed between the first fin elements 310 according to embodiments of the present disclosure. In some embodiments, a dielectric material is first deposited over the substrate 202, filling the trenches interposing the first fin elements 310 with the dielectric material. In some embodiments, the dielectric material may include silicon oxide, silicon nitride, silicon oxynitride, spin-on polymer, spin-on glass, fluorine-doped silicate glass (FSG), a low-k dielectric, or combinations thereof. In various embodiments, the dielectric layer may be deposited by chemical vapor deposition (CVD), thermal oxidation, spin-on coating, flowable CVD, atomic layer deposition (ALD), physical vapor deposition (PVD), or other suitable techniques. One of the operations used to manufacture the FinFET may include, for example, an annealing of the STI features 402 to improve its quality.

In some embodiments, a chemical mechanical polishing (CMP) process may be performed thereafter to remove excessive STI features 402, as well as the hard mask layer 204 and to planarize the top surface of the device. In some embodiments, the operation of removing of the hard mask layer 204 is alternately be performed by using a suitable etching process (e.g., dry or wet etching).

Figure 5:
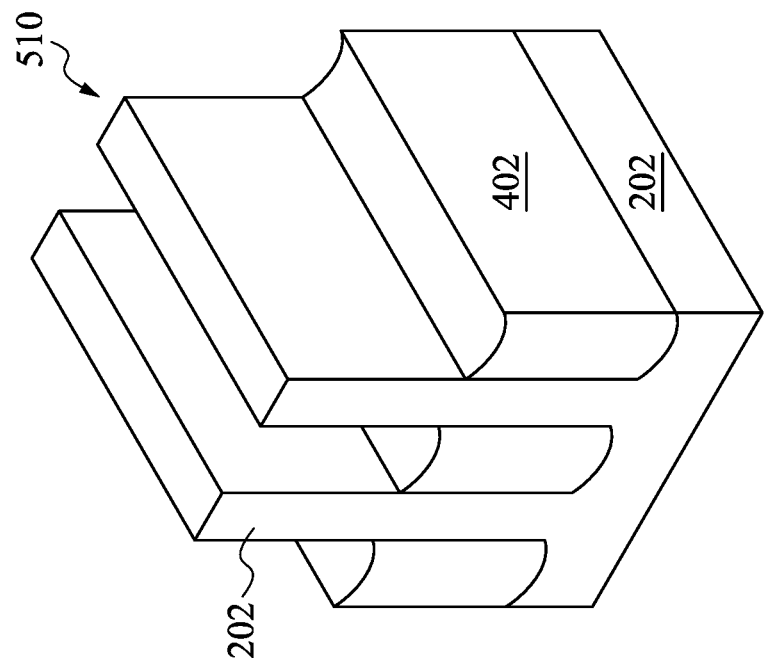

Referring to the example of FIG. 5, the method then proceeds to operation 1008 by recessing the STI features 402 by proper etching processes according to embodiments of the present disclosure. The STI features 402 have been recessed providing fin elements 510, extending above a top surface of the STI features 402. In some embodiments, the recessing process may include a dry etching process, a wet etching process, or a combination thereof.

Figure 6:
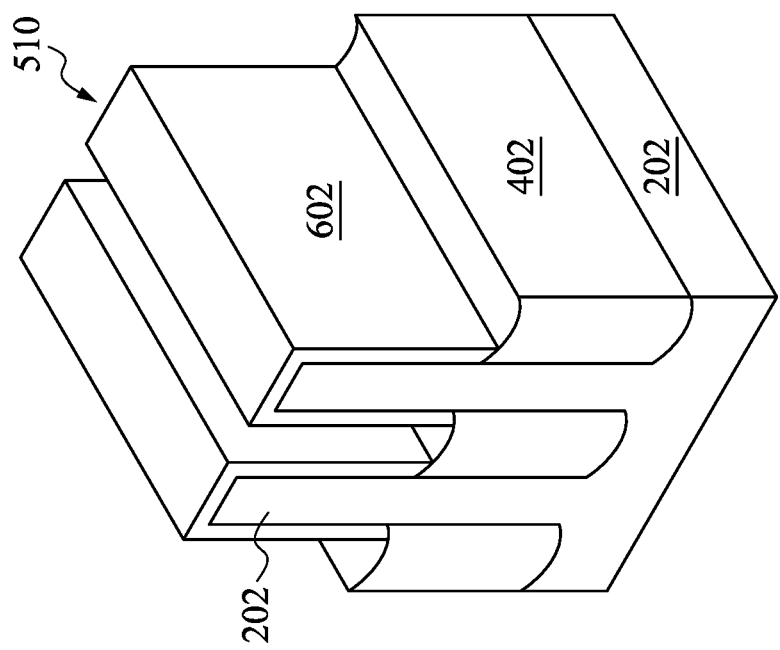

Referring to FIG. 6, the method 1000 then proceeds to operation 1010 where one or more dummy insulating layers 602 are formed on the fin elements 510. The dummy insulating layer 602 may also be referred to as a dummy oxide layer. The dummy insulating layer 602 may be formed by atomic layer deposition (ALD), chemical vapor deposition (CVD), physical vapor deposition (PVD), sub-atmospheric CVD (SACVD), and/or other suitable processes. In some embodiments, the dummy insulating layer 602 may include silicon oxide, silicon nitride, a high-K dielectric material or other suitable material. The dummy insulating layer 602 may be used to prevent damage to the fin elements 510 by subsequent processing and/or to allow for first gate structure during subsequent processing.

Figure 7:
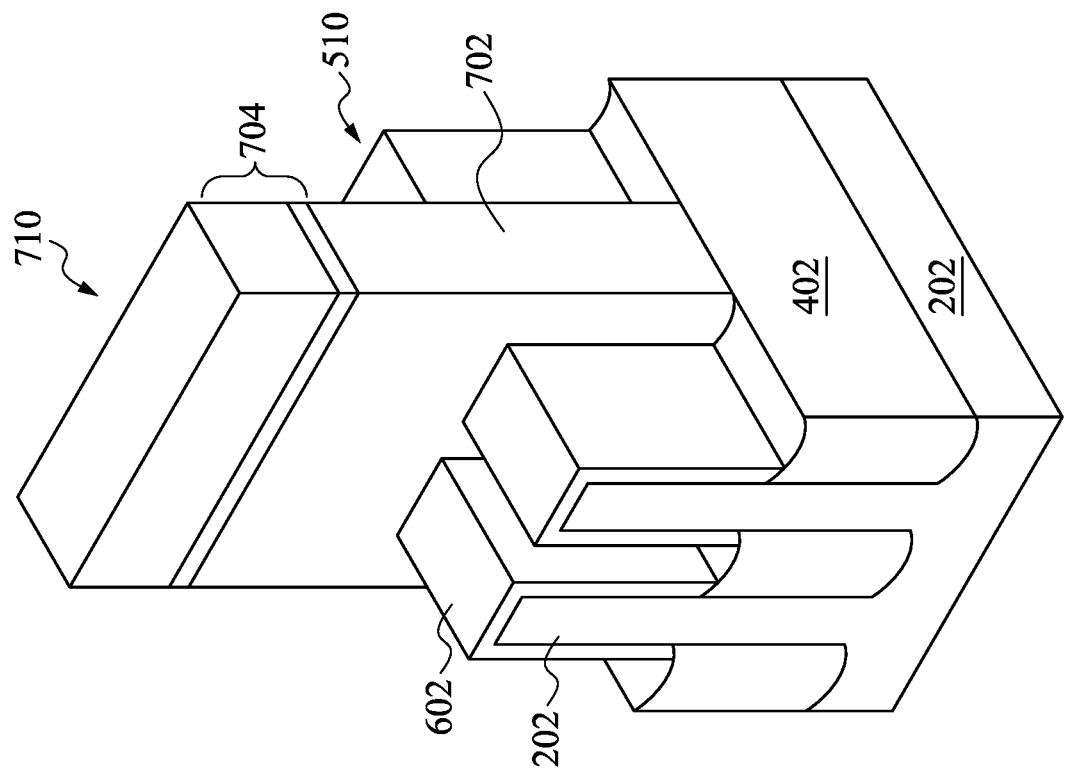

Referring to FIG. 7, the method 1000 proceeds to operation 1012 by forming a first gate structure 710. The first gate structure 710 may also define a source/drain region of the fin elements 510. The first gate structure 710 is intended to be replaced by the final gate structure at a subsequent stage, such that the first gate structure 710 is a dummy gate structure. In an embodiment, the first gate structure 710 is replaced later by high-k dielectric layer (HK) and metal gate electrode (MG) after high thermal temperature processes, such as thermal annealing for source/drain activation during the sources/drains formation. The portion of the fin elements 510 directly underlying the first gate structure is referred to as the channel region.

The first gate structure 710 is formed by a suitable procedure including deposition, lithography and etching. In some embodiments, the deposition includes thermal oxidation, chemical vapor deposition (CVD), physical vapor deposition (PVD), atomic layer deposition (ALD), or other suitable techniques. In some embodiments, the first gate structure 710 includes an electrode layer 702, and a gate hard mask layer 704. The electrode layer 702 may include polycrystalline silicon (polysilicon). The gate hard mask layer 704 may include multiple layers and may include dielectric material, such as silicon oxide, silicon nitride, silicon oxynitride, silicon carbide, or other suitable material.

Figure 8:
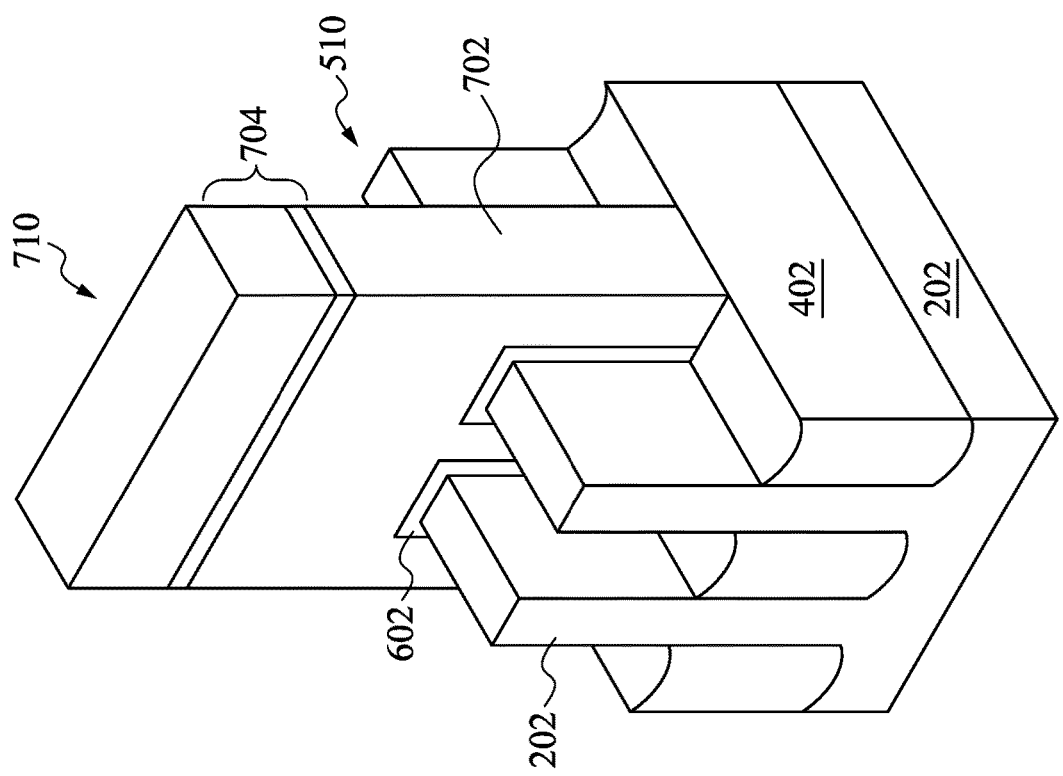

Referring to FIGS. 1 and 8, the method 1000 proceeds to operation 1014 where the dummy insulating layer 602 is removed from the source/drain region of the fin elements 510. The dummy insulating layer 602 may be removed by a suitable selective etching process.

Figure 9:
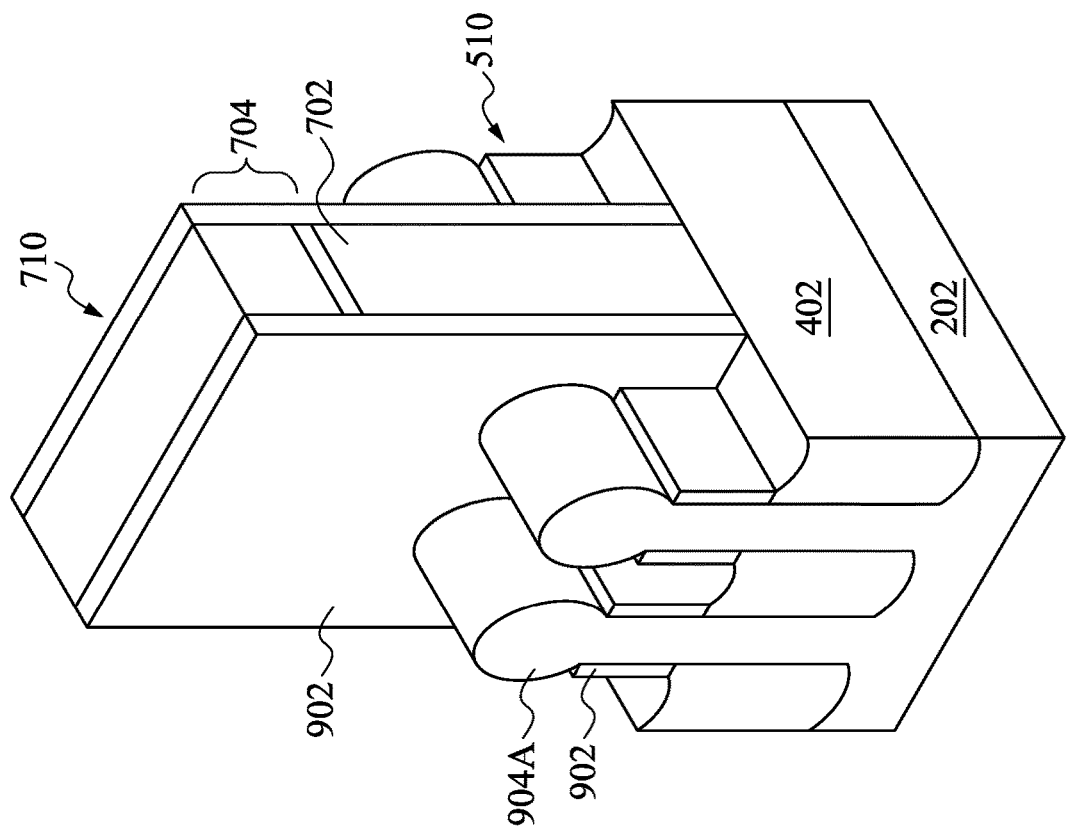

Referring to FIG. 9, the method 1000 then proceeds to operation 1016, according to some embodiments, where spacer layer 902 are formed on the substrate 202 including on the sidewalls of the first gate structure 710 and the fin elements 510. In certain embodiments, the spacer layer 902 is formed conformably on the substrate 202 and followed by an etching back process to expose the top surface of the fin elements 510. In some embodiments, the space spacer layer 902 includes a multiple layers. In some embodiments, the spacer layer 902 may include a dielectric material such as silicon oxide, silicon nitride, silicon carbide, silicon oxynitride, SiCN films, silicon oxycarbide, and/or combinations thereof. By way of example, the spacer layer may be formed by depositing a dielectric material using processes such as, chemical vapor deposition (CVD) process, a sub-atmospheric CVD (SACVD) process, a flowable CVD process, an atomic layer deposition (ALD) process, a physical vapor deposition (PVD) process, or other suitable process.

Referring again to FIG. 9, the method 1000 then proceeds to operation 1018 by forming a source/drain feature 904A.

In one embodiment, the upper portions of the fin elements 510 in the source/drain region are recessed. The source/drain feature 904A is then epitaxially grow grown on the recessed fin elements 510 in the source/drain region. The source/drain feature 904A include includes Ge, Si, GaAs, AlGaAs, SiGe, GaAsP, or other suitable material. In some embodiments, the source/drain feature 904A is formed by one or more epitaxy or epitaxial processes. The source/drain feature 904A may also be doped, such as being in-situ doped during the epitaxial processes. Alternatively, in some embodiments the source/drain feature 904A is not in-situ doped and implantation processes are performed to dope the source/drain feature.

Figure 10:
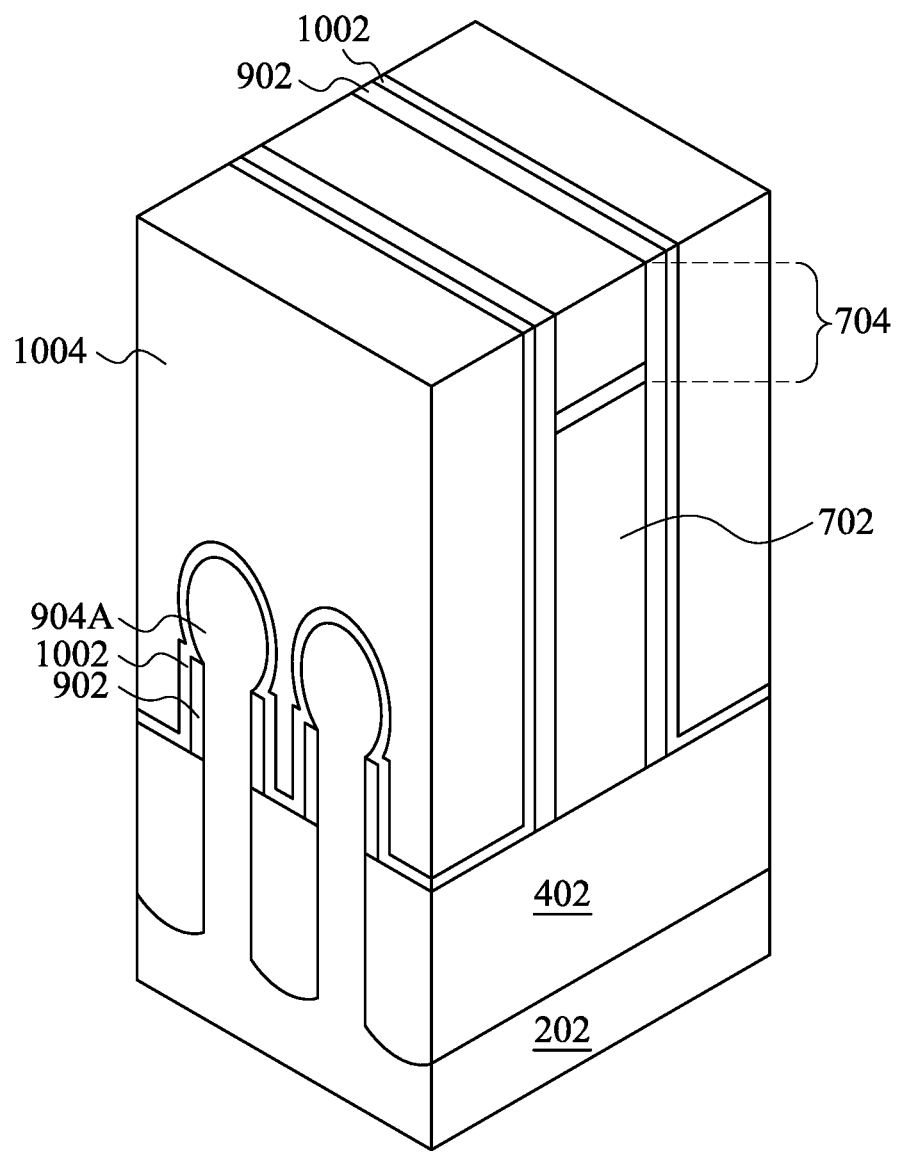

Referring to FIG. 10, the method 1000 then proceeds to operation 1020 where a contact etch stop layer (CESL) 1002 is formed over the substrate 202. In some embodiments, the CESL 1002 is formed by depositing a layer of a silicon nitride layer, silicon oxide layer, a silicon oxynitride layer, and/or other materials known in the art. In some embodiments, the CESL 1002 is formed by plasma-enhanced chemical vapor deposition (PECVD) process and/or other suitable deposition or oxidation processes. In operation 1022, an inter-layer dielectric (ILD) layer 1004 is further formed on the substrate 202 after the CESL 1002 in some embodiments. In embodiments, the ILD layer 1004 includes tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, the ILD layer 1004 includes a single layer or alternative multiple layers. In some embodiments, the ILD layer 1004 is deposited by PECVD process, spin-on (SOG), CVD, or other suitable deposition techniques. A planarization process (ex. CMP) may be performed thereafter to planarize the top surface of the device.

Figure 11:
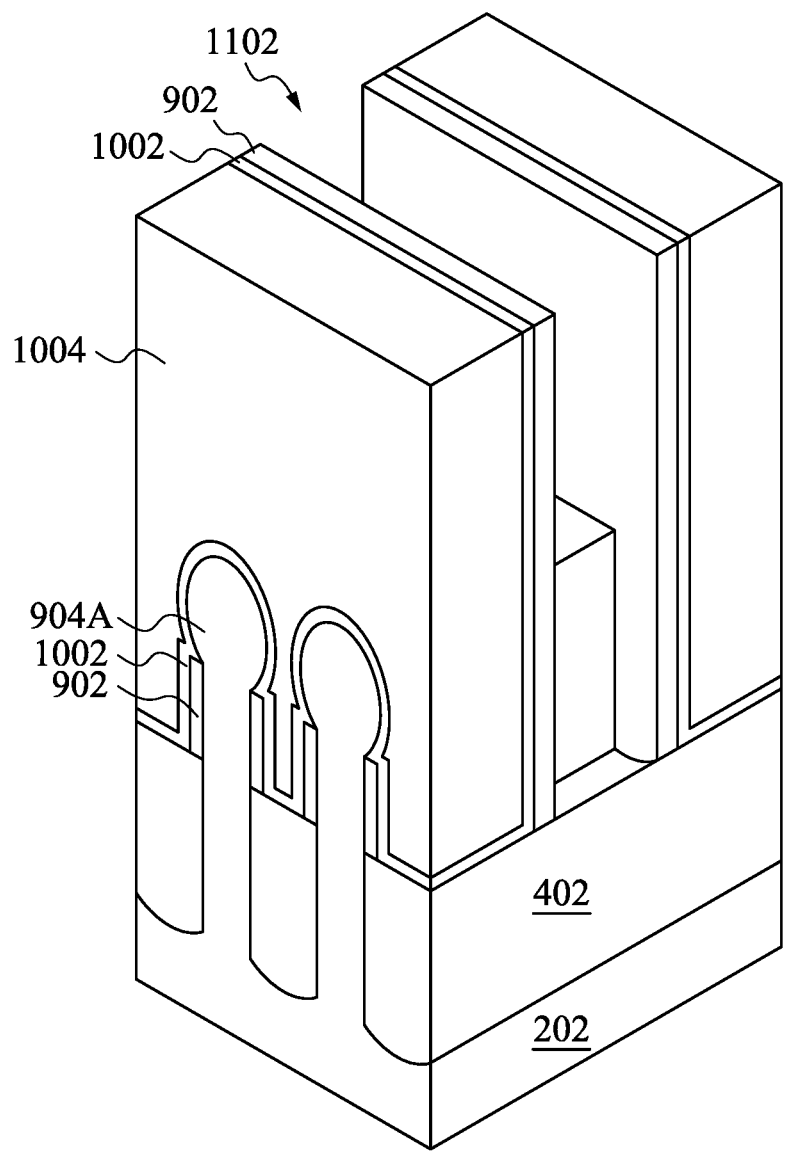

Referring to FIG. 11, the method 1000 then proceeds to operation 1024 where the previously formed first gate structure 710 is removed from the substrate 202 and form a gate trench 1102. The dummy insulating layer 602 over the channel region (i.e., under the first gate structure 710) of the fin elements 510 is also removed. In some embodiments, the first gate structure 710 and the dummy insulating layer 602 are removed in core region by a series of processes including photolithography pattering and etching process; meanwhile, the I/O region is protected from this process.

In some embodiments, the chemical oxide may be removed by a suitable selective etching process such as a dry etching CERTAS® Gas Chemical Etch System by Tokyo Electron Limited, a cleaning process using diluted hydrofluoric (DHF), a Siconi etch (also referred to as SiCoNi), or other suitable etching process.

Figure 12A:
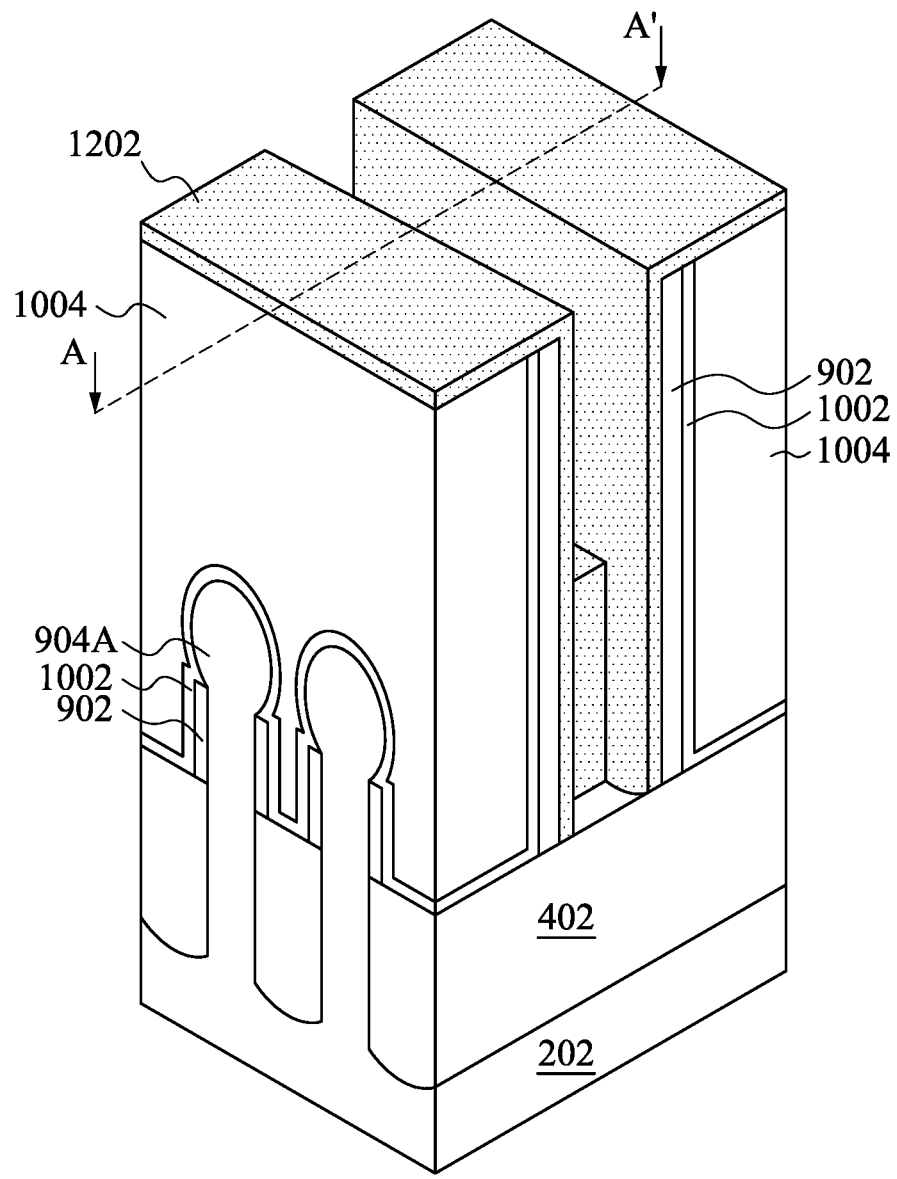
FIG. 12A is an isometric view of the embodiment of the present disclosure.

Referring to FIG. 12A, the method 1000 then proceeds to operation 1026 where an oxide layer 1202 is formed over the substrate 202, including over the channel region of the fin elements 510, and on the sidewall of the spacer layer 902. This operation provides a method to scale gate length without first gate structures 710 collapse. In some embodiments, the oxide layer may include silicon oxide ($SiO_2$), HfSiO, or silicon oxynitride (SiON), or other suitable material. In some embodiments, the oxide layer 1202 is deposited by atomic layer deposition (ALD) technique to achieve conformably and adequate film coverage of wrapping over the fin elements 510 and the sidewall of the spacer layer 902. Alternatively, in various embodiments, the oxide layer 1202 is deposited by chemical vapor deposition (CVD), physical vapor deposition (PVD), or other suitable techniques. The oxide layer 1202 is designed to be a gate structure interfacial layer to scale gate length. In some embodiments, the oxide layer 1202 has a thickness in a range about 1 nm to about 2 nm. The operation 1026 to form the oxide layer 1202 can be performed both in the core region and in the I/O region of the FinFET device.

Figure 12B:
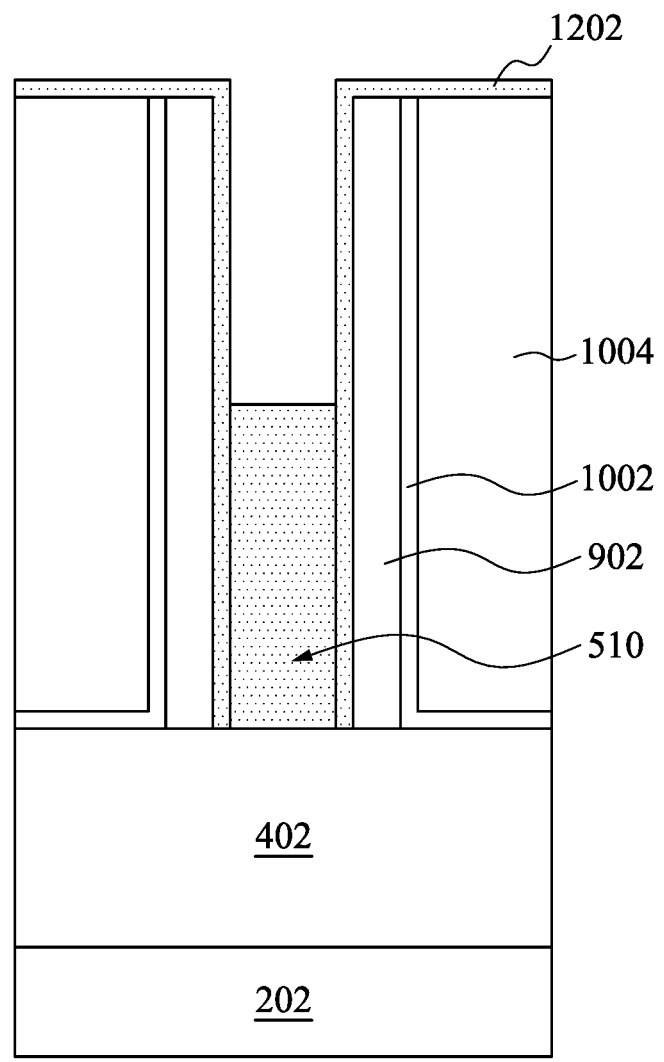
FIG. 12B is a cross-sectional view corresponding to the isometric view of the embodiment of FIG. 12A.

Referring to FIG. 12B, illustrated is a cross-section view of the device along a plane cut as indicated in AA' of FIG. 12A. The oxide layer 1202 wrap over the channel region of the fin elements 510, and the sidewall of the spacer layer 902.

Figure 13A:
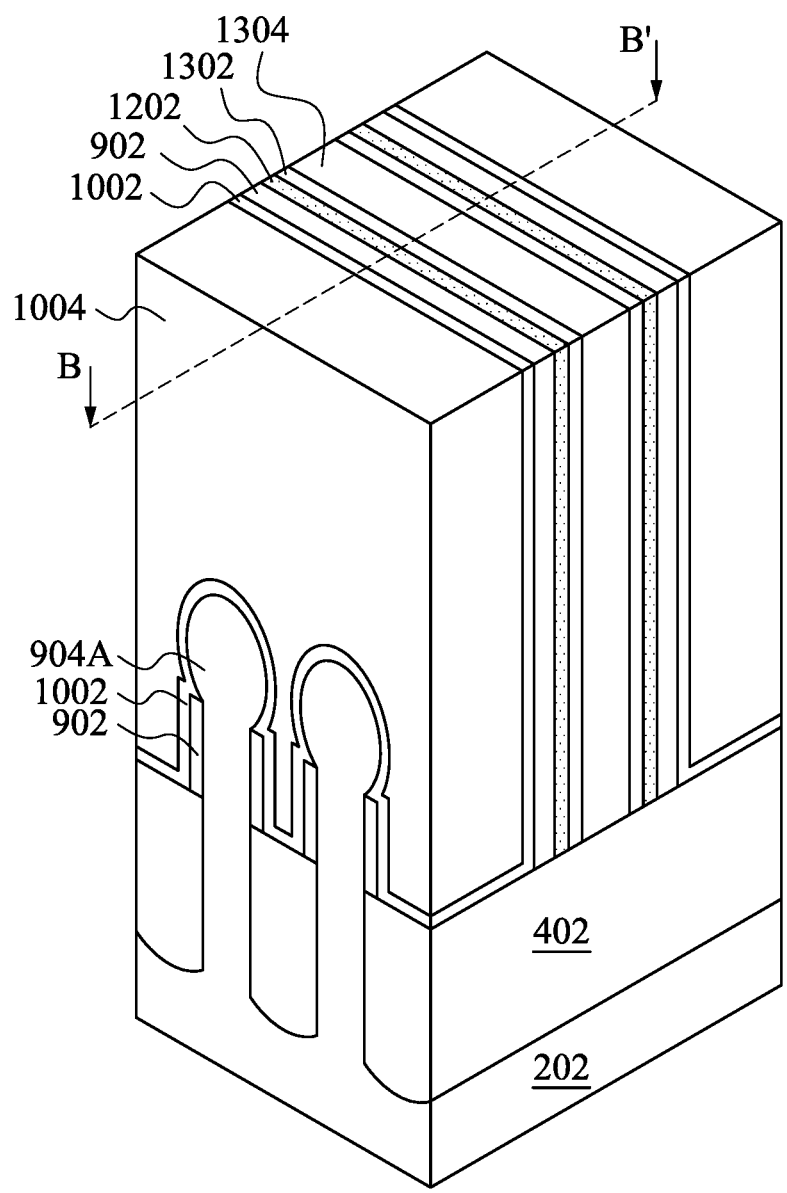
FIG. 13A is isometric view of the embodiment of the present disclosure.

Referring to FIG. 13A, a gate structure is formed within the gate trench 1102 provided by the removal of the first gate structure 710. In some embodiments, the gate structure includes a high-k/metal gate (HK/MG) structure. The gate dielectric layer 1302 may be high-k gate dielectrics, including dielectric materials having a high dielectric constant, for example, greater than that of thermal silicon oxide. The metal gate 1304 used within high-k/metal gate structure may include a metal, metal alloy, or metal silicide. Additionally, the formation of the high-k/metal gate structure includes depositions to form various gate materials and one or more CMP processes to remove excessive gate materials and thereby planarize a top surface of the FinFET devices.

In some embodiments, the gate dielectric layer 1302 may include $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, combinations thereof, or other suitable material. The gate dielectric layer 1302 may be formed by atomic layer deposition (ALD), physical vapor deposition (PVD), chemical vapor deposition (CVD), oxidation, and/or other suitable methods. In some embodiments, the metal gate 1304 includes a single layer or alternatively a multi-layer structure, such as various combinations of a metal gate with a selected work function to enhance the device performance (work function metal layer). In some embodiments, the metal gate 1304 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In some embodiments, the metal gate 1304 may include a polysilicon layer. In some embodiments, the metal gate 1304 may be formed by atomic layer deposition (ALD), physical vapor deposition (PVD), chemical vapor deposition (CVD), e-beam evaporation, or other suitable process. In various embodiments, a CMP process may be performed to remove excessive metal from the metal gate 1304, and thereby provide a substantially planar top surface of the metal gate 1304.

Figure 13B:
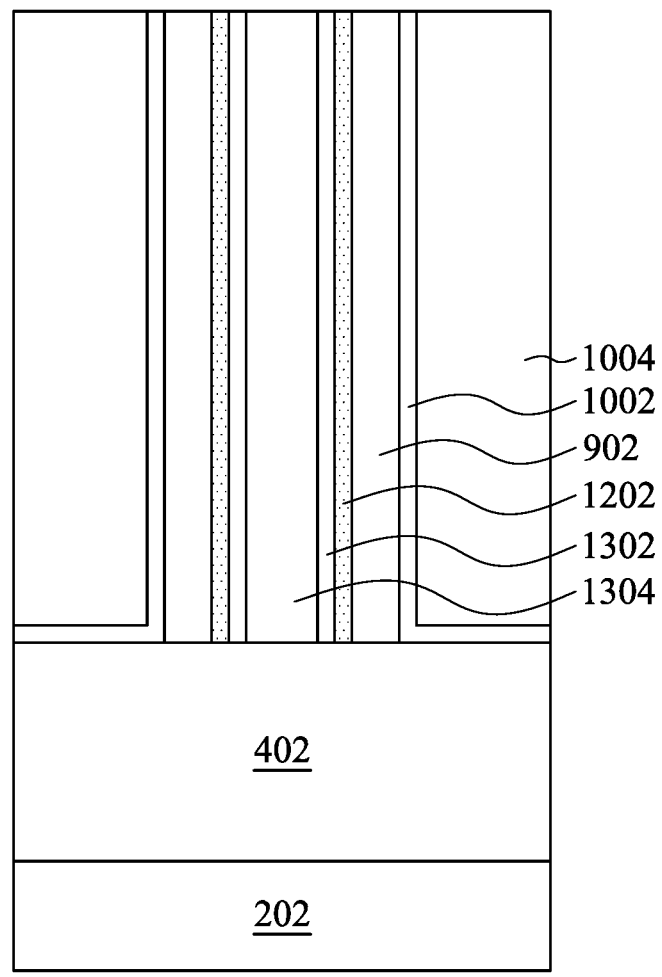
FIG. 13B is a cross-sectional view corresponding to the isometric view of the embodiment of FIG. 13A.

Referring to FIG. 13B, illustrated is a cross-section view of the device along a plane cut as indicated in BB' of FIG. 13A. A combination width of the pair of oxide layers, the pair of gate dielectric layers and the metal gate is equal to a width of the first gate structure.

Base on the above, the present disclosure offers a method to scale gate length without first gate structure collapse by providing an oxide layer after the first gate structure is removed and before high-k/metal gate (HK/MG) structure is formed. In some embodiments, the oxide layer is formed by atomic layer deposition (ALD) to have a conformable oxide layer wrapping over the channel region of the fin elements and the sidewall of the spacer layer. This method can be used both in core region and in I/O region in the FinFET device. The oxide layer may be used as gate structure interfacial layer to replace conventional chemical oxide layer for gate length scale. It can reduce parasite capacitance, increase the reliability of the gate stack and improve gate scaling.

It is noted that the exemplary figures illustrate two fins for the device, however any number of fins is possible and any number of fins may be associated with a given gate structure. It is also noted that additional process operations may be implemented before, during, and after the method 1000, and some process describe above may be replaced or eliminated in accordance with various embodiments of the method 1000. The FinFET device may undergo further processing to form various features and regions known in the art. For example, various lines/vias/contacts, contact openings, contact metal, various interconnect features (e.g., metal layers and interlayer dielectrics), on the substrate 202, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

The present disclosure provides an embodiment of a FinFET device. The device includes a fin on a substrate and a gate structure wrapping the fin. The gate structure includes a metal gate, a pair of gate dielectric layers adjacent to the metal gate, a pair of oxide layers adjacent to the pair of gate dielectric layers; and a pair of spacer layers adjacent to the oxide layers. The device also includes a source/drain region next to the two sides of the gate structure and a contact etch stop layer next to the source/drain region and overlying the substrate. This feature may be found in the core regions or in the I/O regions in the FinFET device.

The present disclosure also provides another embodiment of FinFET device. The device includes a fin on a substrate and a metal gate wrapping the fin and a gate stack layer adjacent to the metal gate. The gate stack layer comprises a pair of gate dielectric layers, a pair of spacer layers, and a pair of oxide layers sandwiched by the high-k layers and the spacer layers. The device further includes a contact etch stop layer next to the source/drain region and overlying the substrate. This feature may be found in the core regions or in the I/O regions in the FinFET device.

The present disclosure provides a method for fabricating a FinFET device. The method includes forming a fin on a substrate and forming a first gate structure wrapping the fin. A pair of spacers is formed adjacent to the first gate structure. The first gate structure is removed. A pair of oxide layers is deposited adjacent to the pair of spacers. A pair of gate dielectric layers is deposited next to the pair of oxide layers. A metal gate is formed between the pair of high-k layers. This method may be used in the core regions or in the I/O regions in the FinFET device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A FinFET, comprising:
   a substrate having core and I/O regions, each of which includes:
   a fin;
   a gate structure wrapping the fin and comprising:
   a metal gate;
   a gate dielectric layer having a first portion sandwiched between the fin and the metal gate and second portions respectively extending substantially along sidewalls of the metal gate;
   an oxide layer in direct contact with sidewalls of the gate dielectric layers and sandwiched between the fin and the metal gate; and
   a pair of spacer layers adjacent to the oxide layer, wherein each of the spacer layers has an inner sidewall facing the metal gate and a substantially straight outer sidewall opposite to the inner sidewall, and wherein the substantially straight outer sidewall of each of the spacer layers extends from a bottommost surface to a topmost surface of the corresponding spacer layer;
   a source/drain region next to two sides of the gate structure; and
   a channel region next to the source/drain region.

2. The FinFET of claim 1, wherein the gate dielectric layer is a high-k dielectric layer.

3. The FinFET of claim 1, wherein the oxide layer has a thickness in a range of about 1 nm to about 2 nm.

4. The FinFET of claim 1, wherein the oxide layer comprises SiO2, HfSiO, SiON, or a combination thereof.

5. The FinFET of claim 1, further comprising an isolation structure in contact with the substrate and adjacent to the fin, wherein the gate dielectric layers are in contact with the isolation structure.

6. A FinFET, comprising:
   a substrate having core and I/O regions, each of which includes:
   a fin structure comprising a source/drain region;
   an isolation structure around a bottom portion of the fin structure;
   a metal gate wrapping the fin structure;
   a gate stack layer adjacent to the metal gate and comprising:
   a gate dielectric layers having a first portion sandwiched between the fin and the metal gate and second portions respectively extending substantially along sidewalls of the metal gate;
   a pair of spacer layers;
   an oxide layer sandwiched between the gate dielectric layer and the spacer layer, and between the fin and the metal gate, wherein the oxide layer is in direct contact with the spacer layers; and
   a pair of contact etch stop layers, wherein each of the contact etch stop layers has a first portion extending substantially along an outer sidewall of one of the spacer layers and a second portion extending substantially along a top surface of the isolation structure, and wherein the first portion of each of the contact etch stop layers has an substantially straight sidewall extending from a topmost surface of the corresponding contact etch stop layer to the second portion of the corresponding contact etch stop layer.

7. The FinFET of claim 6, wherein the oxide layer has a thickness in a range of about 1 nm to about 2 nm.

8. The FinFET of claim 6, wherein the gate dielectric layer is high-k dielectric layer.

9. The FinFET of claim 6, wherein each of the contact etch stop layer comprises silicon nitride layer, silicon oxide layer or both.

10. The FinFET of claim 6, wherein the oxide layer comprises SiO2, HfSiO, SiON, or a combination.

11. The FinFET of claim 6, wherein the gate stack layer is formed in a core region or in an I/O region of the FinFET over the substrate.

12. The FinFET of claim 6, wherein a portion of the isolation structure directly under the metal gate is free from coverage by the gate dielectric layer.

13. A method for manufacturing a FinFET, the method comprising:
    forming a fin on a substrate having a source/drain region and a channel region;
    forming a dummy insulating layer over the channel region;
    forming a first gate structure wrapping the fin;
    forming a pair of spacers adjacent to the first gate structure, wherein each of the spacer layers has an inner sidewall facing the first gate structure and a substantially straight outer sidewall opposite to the inner sidewall, and wherein the substantially straight outer sidewall of each of the spacer layers extends from a bottommost surface to a topmost surface of the corresponding spacer layer;
    removing the first gate structure;
    after removing the first gate structure, performing an etching process to remove the dummy insulation layer on a core region of the substrate;
    while performing the etching process, protecting an I/O region of the substrate from the etching process;
    depositing a pair of oxide layers adjacent to the pair of spacers;
    depositing a pair of gate dielectric layers next to the pair of oxide layers; and
    forming a metal gate between the pair of gate dielectric layers.

14. The method of claim 13, wherein a combined width of the pair of oxide layers, the pair of gate dielectric layers and the metal gate is equal to a width of the first gate structure.

15. The method of claim 13, wherein forming the fin on the substrate comprises:
    patterning fin elements on the substrate;
    forming STI features interposing the fin elements; and
    recessing the STI features.

16. The method of claim 13, wherein depositing the oxide layers is performed by an atomic layer deposition process.

17. The method of claim 13, further comprising:
    forming a source/drain epitaxial layer on the source/drain region;
    forming a contact etch stop layer; and
    forming an inter-layer dielectric layer.

18. The method of claim 17, wherein forming the contact etch stop layer is by depositing a layer of silicon nitride, silicon oxide or both.

19. The method of claim 13, wherein removing the first gate structure further comprises removing the dummy insulating layer at a channel region.

20. The method of claim 13, wherein forming the spacers is such that the spacer layers are sandwiched between the source/drain region and a contact etch stop layer.

* * * * *